United States Patent
Roesner et al.

(10) Patent No.: US 7,158,408 B2
(45) Date of Patent: Jan. 2, 2007

(54) CURRENT SOURCE CONTROL IN RFID MEMORY

(75) Inventors: Bruce B. Roesner, San Diego, CA (US); Peter A. Nanawa, San Diego, CA (US)

(73) Assignee: ID Solutions, Inc., Taipei (TW)

( * ) Notice: Subject to any disclaimer, the term of this patent is extended or adjusted under 35 U.S.C. 154(b) by 142 days.

(21) Appl. No.: 10/787,875

(22) Filed: Feb. 25, 2004

(65) Prior Publication Data

US 2005/0185460 A1 Aug. 25, 2005

(51) Int. Cl.
*G11C 11/34* (2006.01)

(52) U.S. Cl. .......................... 365/185.02; 365/185.21; 365/192

(58) Field of Classification Search ........... 365/185.02, 365/185.21, 192, 226; 340/10.1, 572.1; 455/41.2
See application file for complete search history.

(56) References Cited

U.S. PATENT DOCUMENTS

| | | | |
|---|---|---|---|
| 6,201,731 B1 * | 3/2001 | Kamp et al. ........... | 365/185.02 |
| 6,288,629 B1 * | 9/2001 | Cofino et al. .............. | 340/10.1 |
| 6,677,852 B1 * | 1/2004 | Landt ........................ | 340/10.1 |
| 2001/0050580 A1 * | 12/2001 | O'Toole et al. ............. | 327/158 |
| 2003/0112128 A1 * | 6/2003 | Littlechild et al. ....... | 340/10.52 |
| 2004/0192011 A1 | 9/2004 | Roesner | |
| 2004/0215350 A1 | 10/2004 | Roesner | |

OTHER PUBLICATIONS

TechWeb definition of EEPROM (n.d.). Retrieved Nov. 10, 2005 from http://www.techweb.com/encyclopedia/printArticlePage.jhtml?term=EEPROM.*
International Search Report and Written Opinion for Corresponding Application PCT/US05/06036. Mailed Jun. 27, 2006.*

* cited by examiner

*Primary Examiner*—Richard Elms
*Assistant Examiner*—Alexander Sofocleous
(74) *Attorney, Agent, or Firm*—Fish & Richardson P.C.

(57) ABSTRACT

These systems and techniques relating to RFID tags include current source control in RFID memory. According to an aspect, a radio frequency identification tag includes an antenna, a radio frequency interface coupled with the antenna, and a non-volatile memory including multiple memory cells, at least one of the memory cells including a floating gate, a control gate, and a dielectric there between. The non-volatile memory includes a controlled current source operable to modify the at least one memory cell. Additionally, the non-volatile memory can include a voltage supply line regulator that limits voltage supply based on a sensed operational current that results from the controlled current source in the non-volatile memory.

18 Claims, 21 Drawing Sheets

CURRENT SOURCE CONTROL IN RFID MEMORY

BACKGROUND

The present application describes systems and techniques relating to radio frequency identification (RFID) tag design and use, for example, an RFID chip design that facilitates programming and erasing of a non-volatile memory included within the RFID tag.

Traditional RFID tags have included non-volatile memory, such as electrically erasable programmable read-only memory (EEPROM). Programming of RFID memory involves properly setting the voltage, which can be complicated because of the high voltages frequently required to program EEPROM memory cells. Additionally, the charge captured by an EEPROM memory cell during programming changes exponentially with the voltage. Sufficient voltages should be achieved to guarantee programming of the memory cell, but too much voltage can cause catastrophic failure of the circuitry.

A typical approach to programming an RFID memory relies on trial and error. A low voltage is first applied in the programming cycle to assure that the circuitry does not become damaged and that the memory is not overstressed, which can lead to reliability problems. If the programming is found to be successful through a subsequent read of the memory, further programming is not needed. However, in many cases the programming is found to be insufficient so a second cycle is applied with a slightly higher voltage, and this may be repeated many times until the memory is properly programmed. This technique can require numerous cycles and considerable time.

SUMMARY

The present disclosure includes systems and techniques relating to RFID tags including current source control in RFID memory. According to an aspect, a radio frequency identification tag includes an antenna, a radio frequency interface coupled with the antenna, and a non-volatile memory including multiple memory cells, at least one of the memory cells including a floating gate, a control gate, and a dielectric there between. The non-volatile memory includes a controlled current source operable to modify the at least one memory cell. Additionally, the non-volatile memory can include a voltage supply line regulator that limits voltage supply based on a sensed operational current that results from the controlled current source in the non-volatile memory.

According to another aspect, a system includes a radio frequency identification (RFID) tag conveyor, a substrate having multiple RFID tags thereon, each RFID tag including a non-volatile memory having a controlled current source operable to modify memory cells in the non-volatile memory, and a programmer. The substrate can be a reel-form substrate, and the RFID tag conveyor can include at least two reels. Moreover, the programmer can be configurable to read the RFID tags, erase the RFID tags and program the RFID tags.

Using the systems and techniques described, a memory cell in a non-volatile memory of a radio frequency identification tag can be modified (programmed or erased) by forcing a current in a bit line of the non-volatile memory for a predetermined period of time. The systems and techniques described can result in faster programming times and can facilitate accurately controlling the voltage on a chip so as not to cause damage to circuitry.

Details of one or more implementations are set forth in the accompanying drawings and the description below. Other features and advantages may be apparent from the description and drawings, and from the claims.

DRAWING DESCRIPTIONS

Like reference symbols in the various drawings indicate like elements.

DETAILED DESCRIPTION

Figure 1:
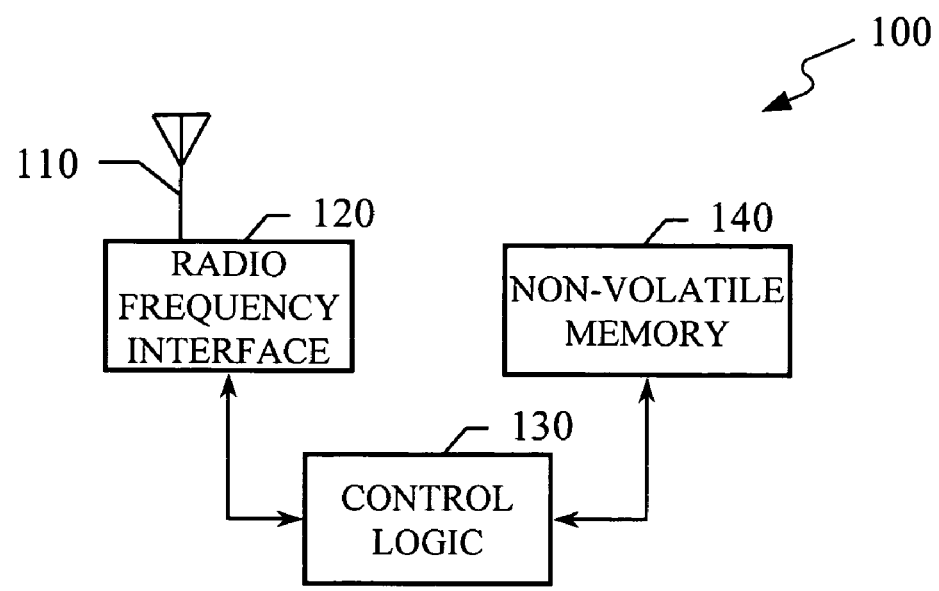
FIG. 1 illustrates an RFID tag including current source control in the RFID memory.

FIG. 1 illustrates an RFID tag 100 including current source control in the RFID memory. The RFID tag 100 includes an antenna 110, a radio frequency (RF) interface 120, and a non-volatile memory 140. The tag 100 can also include control logic 130.

The RFID tag 100 can be a low frequency or high frequency tag, and in general, the systems and techniques described can be applied to the full range of RFID (e.g., currently including 125 KHz, 13.56 MHz, 900 MHz, and 2.45 GHz tags). For example, the antenna 110 can be a near-field coupling element configured to operate in a high frequency band. The RFID tag 100 can be a passive or active RFID tag. The tag 100 can obtain its power from an inductive coupling of the tag to energy circulating around a reader coil. Alternatively, the tag 100 can use radiative coupling.

The RF interface 120, the control logic 130 and the memory 140 can be combined in a single integrated circuit (IC), such as a low-power complementary metal oxide semiconductor (CMOS) IC chip. The RF interface 120 can be an analog portion of the IC, and the control logic 130 and the memory 140 can be a digital portion of the IC.

The IC can also include an antenna tuning capacitor and an RF-to-DC rectifier system designed for the antenna 110, which can be the coupling element for the tag 100. The antenna 110 can enable the RFID tag to obtain power to energize and activate the tag's chip. The antenna 110 can have many different shapes and sizes, depending on the type of RFID coupling system being employed. The control logic 130 can include both digital control and data modulation circuits. The non-volatile memory 140 includes a controlled current source used in modifying (programming or erasing) the memory cells inside, and the non-volatile memory 140 can be an electrically erasable programmable read only memory (EEPROM).

Figure 2:
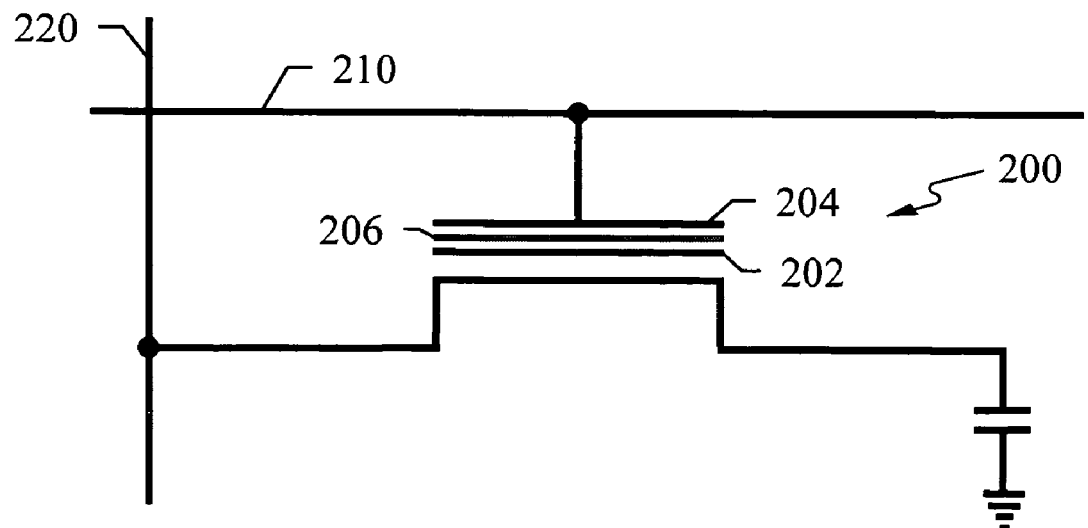
FIG. 2 illustrates a non-volatile memory cell.

FIG. 2 illustrates a non-volatile memory cell 200 that is coupled with a word line 210 and a bit line 220, such as can be used in the RFID tag of FIG. 1. The memory cell 200 includes a floating gate 202, a control gate 204, and a dielectric 206 there between. The dielectric 206 can be any number of dielectric materials, depending on the application, such as an oxide layer or an oxide/nitride layer.

Fowler Nordheim (FN) tunneling current is used in programming the cell 200. This FN tunneling current can be very difficult to control due to the exponential variation in current with electric field. The field strength across the dielectric is a function of both the applied voltage and the thickness of the dielectric. Field strength increases linearly with applied voltage and inversely with the thickness of the dielectric. Utilizing measured data from a typical silicon foundry supplier, the exponential component used to describe the relationship was found to be approximately 30:

$$I = C_1 \times (V/t)^{30} \quad (1)$$

where I=current, V=voltage, t=oxide thickness, and $C_1$=constant.

Using this relationship, the variation in the current can be seen to vary considerably. The current used in programming an EEPROM cell is directly proportional the charge accumulated on the floating gate. The programming time required is inversely proportional to the current:

$$T = C_2/I \quad (2)$$

where T=programming time, and $C_2$=constant. Therefore, the programming time has the same exponential dependence on the voltage and oxide thickness:

$$T = C_3 \times (t/V)^{30} \quad (3)$$

where $C_3 = C_2/C_1$.

Assuming that the oxide thickness can vary wafer-to-wafer and lot-to-lot by at least +/−2%, the ratio in the programming time would change by a ratio of 3.24. If the total programming voltage across the gate to source is controlled between the limits of 17.5 to 18.5 volts, this would affect the programming time by a ratio of 5.30. Therefore, the programming time based on these two independent parameters would vary by a factor of 17.18. To put this in perspective, if the chip design is configured for the highest voltage and thinnest oxide, it would take 17.18 times longer to program at the lowest voltage and thickest oxide (most difficult to program). If the voltage window is only controlled to 2 volts, this number becomes 91.23. Even if the voltage can be controlled by 0.5 volts, the programming time would vary by a factor of 7.38.

The solution is to control the programming current. This eliminates the variability associated with thickness of the dielectric and voltage control. Typical current sources can be controlled to within +/−20% correlating to a ratio of 1.5. This is considerably better than even the best case above, of 7.38, with voltage regulation. In addition, the circuit and current requirements can be reduced.

Controlling the current through a memory cell can eliminate the need for the trial and error approach to programming. By guaranteeing the proper programming current, overstressing of the cell and insufficient programming can be eliminated.

Figure 3:
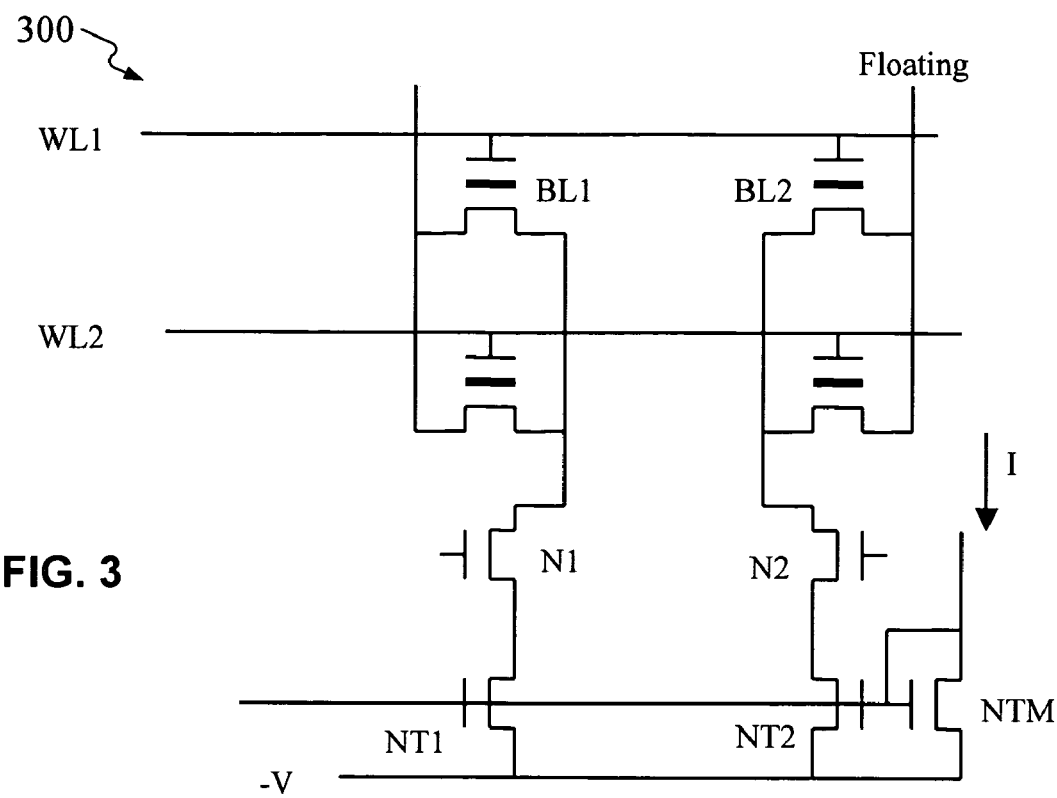
FIG. 3 illustrates example RFID memory circuitry including a controlled current source.

FIG. 3 illustrates example RFID memory circuitry 300 including a controlled current source. This type of circuit can be used in controlling current through the memory cells of an RFID tag's non-volatile memory. Word 1 (WL1) can be set to a high voltage (e.g., 12 volts) while Word 2 (WL2) is set low (e.g., 0 volts), thus disabling any writing of cells connected to Word 2. Transistor N1 can be turned off while transistor N2 is turned on. This assures that bit 2 (BL2) is programmed while bit 1 (BL1) is not programmed. The source of the bit line can be at −V, with the drain left floating. Transistor NTM is used as a current mirror to set up constant currents in each of the bit lines (e.g., through NT2 but not NT1 when N2 is turned on and N1 is turned off). Each bit line seeks its own voltage level to assure the proper level of current and thus, consistent programming.

Although each individual bit and word line voltage can be controlled so as not to reach excessive voltages, the decode circuitry and voltage supply lines may achieve much higher levels unless regulated. The circuitry of FIG. 3 can be enhanced to control the internal voltage supply lines or voltage applied to an RFID chip.

Figure 4:
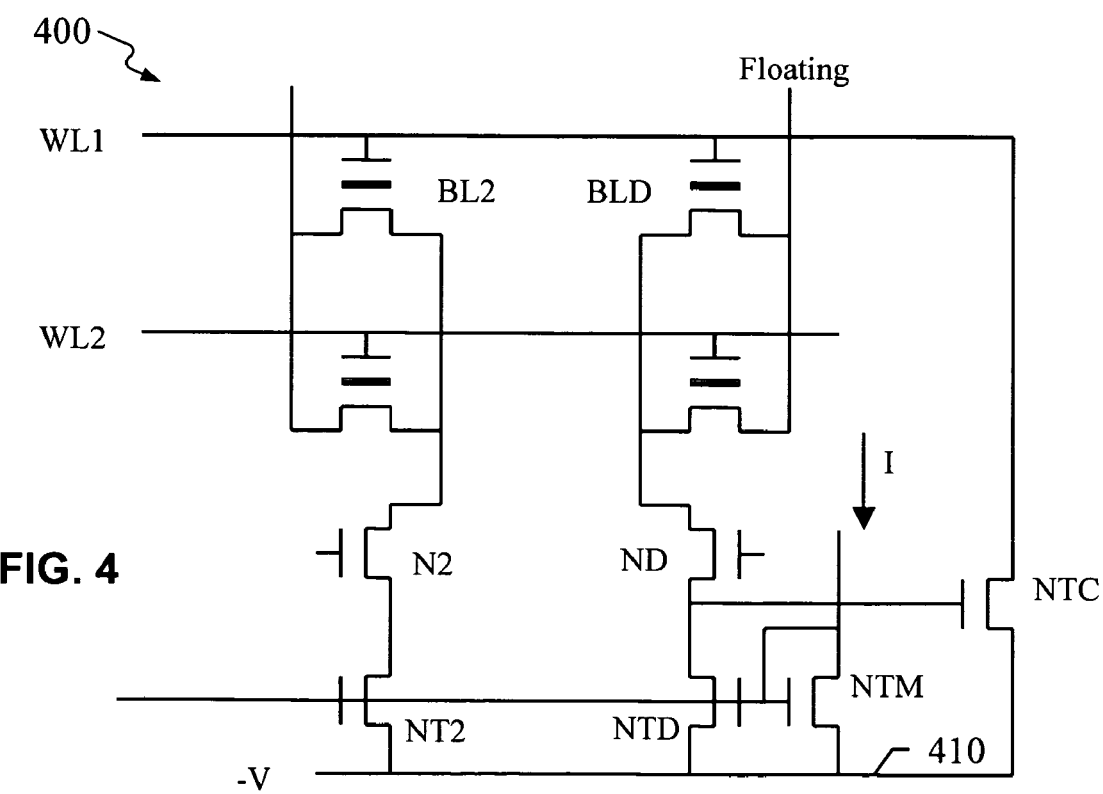
FIG. 4 illustrates example RFID memory circuitry including a voltage supply line regulator and a controlled current source.

FIG. 4 illustrates example RFID memory circuitry 400 including a voltage supply line regulator and a controlled current source. By adding a dummy cell (BLD, which can be one of multiple dummy cells on a full bit line including transistor ND) that is programmed during each program cycle, the current can be sensed and used to limit the chip's voltage. The voltage on the source of current source NTD will rise as the desired current is achieved. Transistor NTC is turned on once the voltage rises above its threshold. Transistor NTC can be made large enough to load the voltage supply line 410 and cause the voltage to be controlled.

Figure 5:
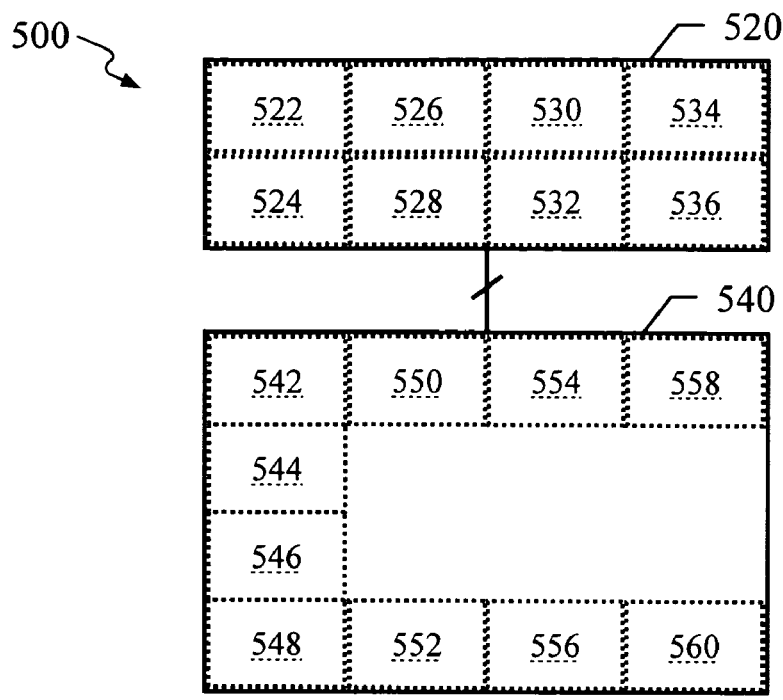
FIGS. 5 and 8–25 illustrate an additional example of RFID memory circuitry including a voltage supply line regulator and a controlled current source.

Thus, the circuit acts as a feedback loop so that any time the voltage line tries to rise beyond what is necessary to program the cell, it is sensed at the source of NTD and additional loading of the supply line takes place (current is pulled from the supply line). Although this example retains the current control on each bit line, it could also be applied without individual current sources. Since the voltage can be well controlled with the dummy cell, and the variation in the memory cells within a chip's memory is frequently minimal, a single voltage regulator monitoring the dummy cell can suffice in controlling the programming. In addition, although FIGS. 4 and 5 discuss programming of the memory, the systems and techniques described can also be applied to erasing the memory.

FIGS. 5 and 8–25 illustrate an additional example of RFID memory circuitry 500 including a voltage supply line regulator and a controlled current source. The RFID memory circuitry 500 includes memory array circuitry 540 and bit line control circuitry 520. The memory array circuitry 540 is a 33×33 memory array, and details of the circuitry 540 are shown in FIGS. 8–17 in sections 542–560.

Details of the bit line control circuitry 520 are shown in FIGS. 18–25 in sections 522–536. In the bit line control circuitry 520, the current is set up with current mirrors using a voltage reference (VREFN) which can be generated in another section. By selecting various combinations of the six N channel (I93–I98) and six P channel (I100–I104, I114) transistors, the current selected through the bit lines can be varied by a factor of 36. This allows setting of the programming time. The programming time can be reduced by increasing the bit line current.

Current into each of the bit lines is therefore controlled independently through the P channel transistors I15 and I26–I57. The switching transistors I25 and I59–I90 control which bits are to be programmed. In the normal erase mode, all the switching transistors are on so that all the bits are simultaneously erased. Also, the P channel current sources need only be activated in the program and erase modes, at which time PR is high and transistor I106 is turned on. The four sets of bit lines (8 bit bytes each) are then fed into the memory array.

An additional P channel current source (I92) and switching transistor (I91) have been added to the bit control circuitry. The BLB4 line is used to set the voltage regulation for the chip's voltage supply.

Figure 6:
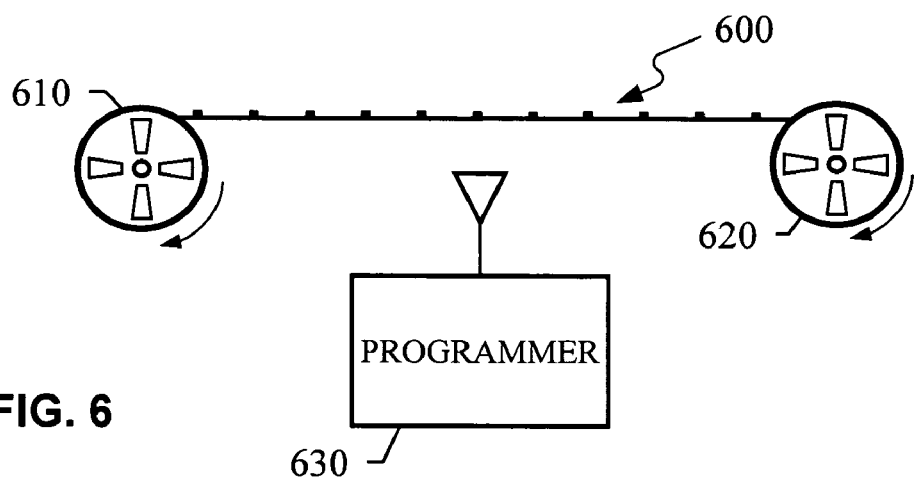
FIG. 6 illustrates an RFID tag programming system.

The systems and techniques described can be used in programming and erasing RFID memory in deployed RFID tags (i.e., tags already attached to target objects) or as part of an RFID manufacturing process. FIG. 6 illustrates an RFID tag programming system. The system includes an RFID tag conveyor including two reels 610, 620 that moves a reel-form substrate 600, having multiple RFID tags, by a programmer 630. The programmer 630 can include functionality allowing reading, erasing and programming of the RFID tags. For example, the tags may be manufactured well in advance of use, preprogrammed with inventory information, and stored on the reel 610. Then, when the tags are to be sold for use in a particular application, the substrate 600 can be attached to the second reel 620, passed by the programmer 630 and prepared for the application: having the inventory information read and erased, and new application-specific information programmed in.

Using the systems and techniques described, the RFID memory in the tags can be quickly modified as needed by forcing a current in a bit line of the memory for a predetermined period of time. Given the design of the RFID tags and the corresponding defined time period needed to modify the memory, the total charge applied to the memory cells is known, and the tags can be properly programmed without using a testing operation.

Figure 7:
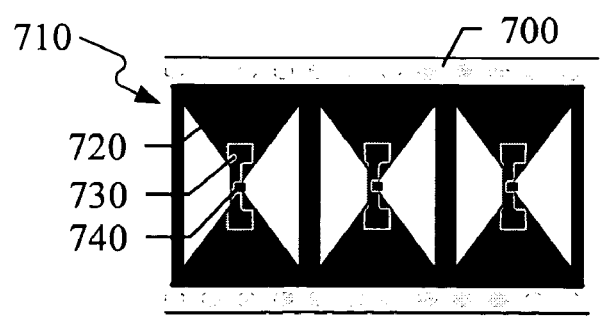
FIG. 7 illustrates a reel-form substrate having modular RFID tags thereon.
Figure 8:
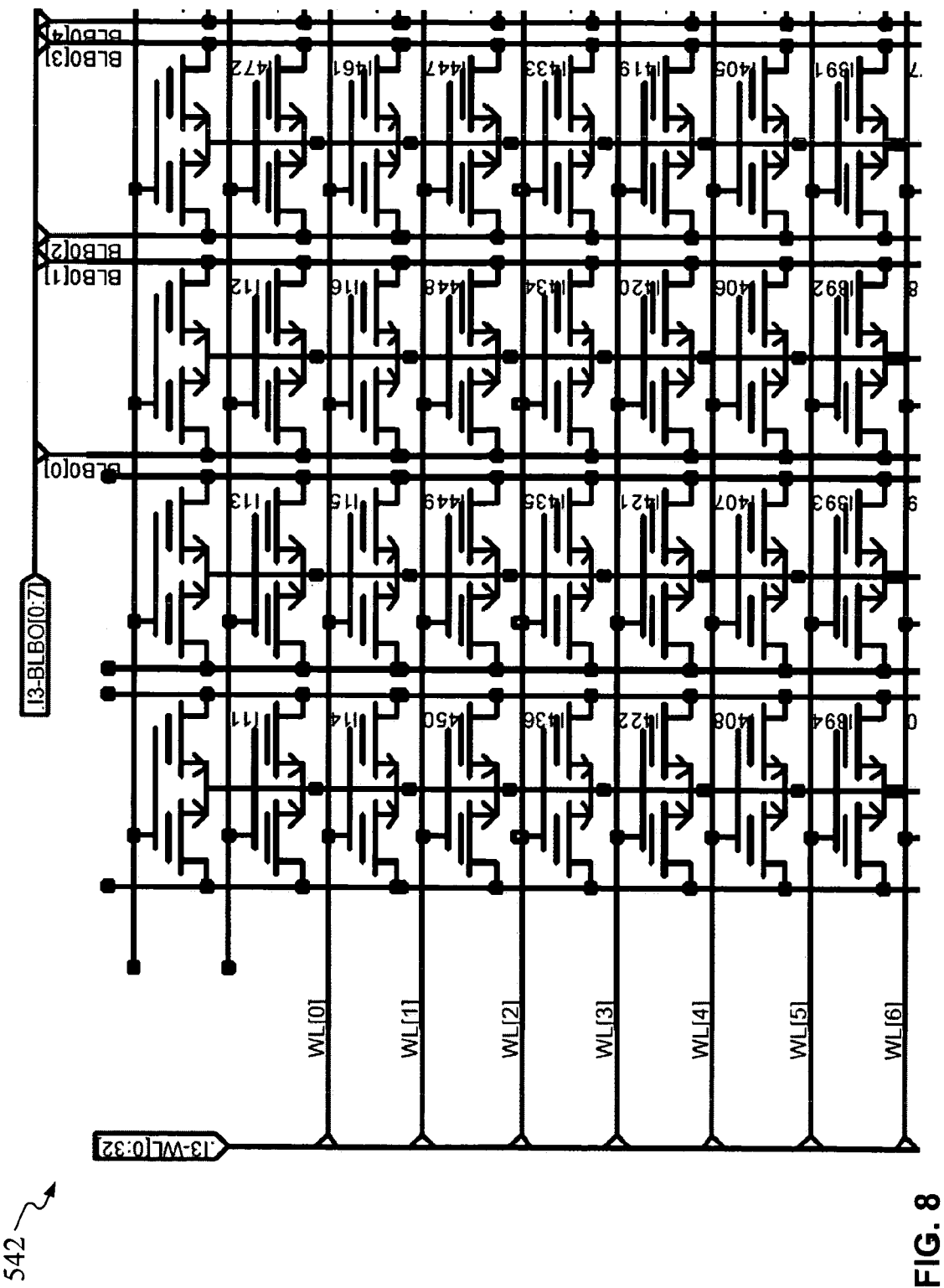
Figure 9:
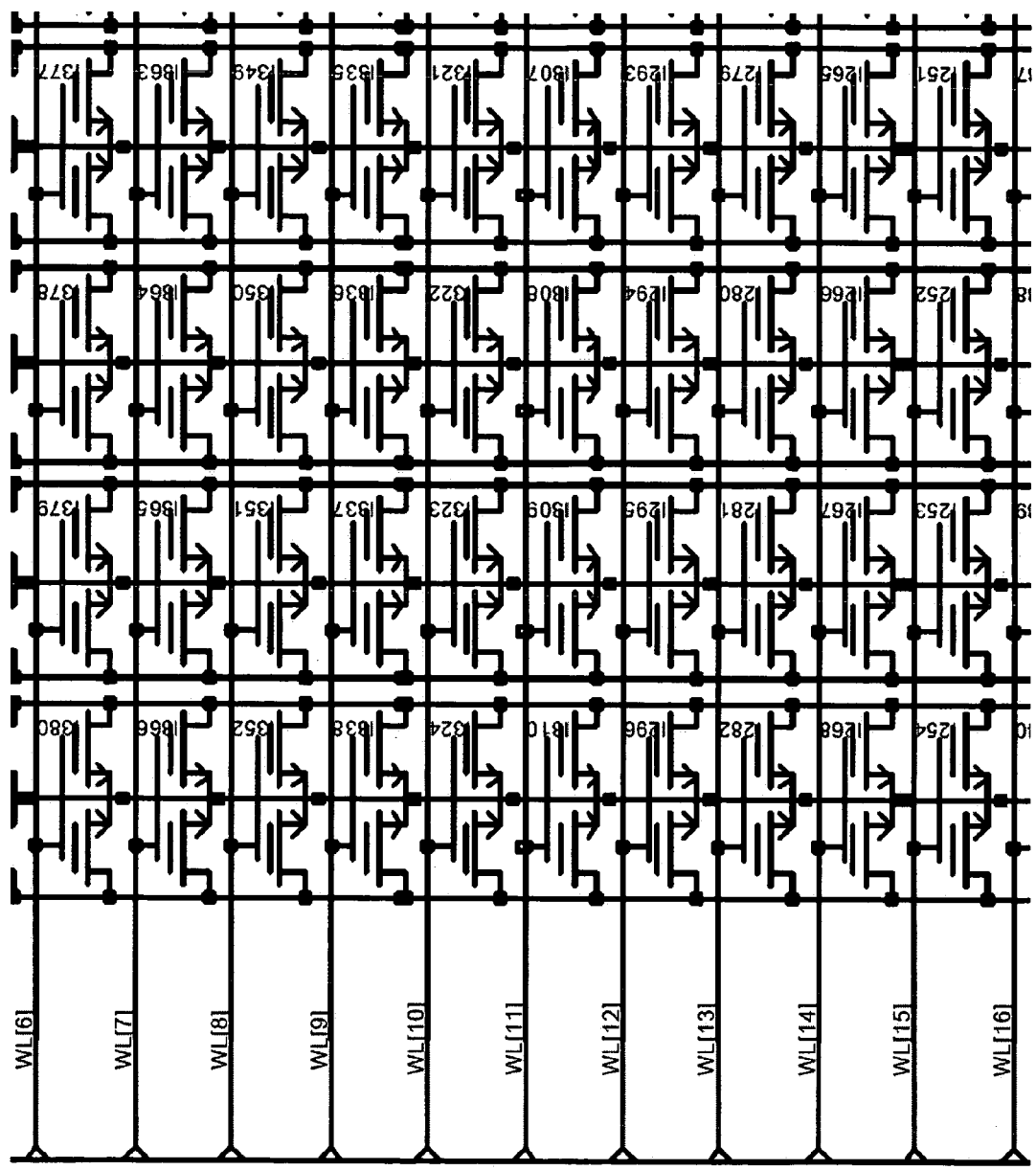
Figure 10:
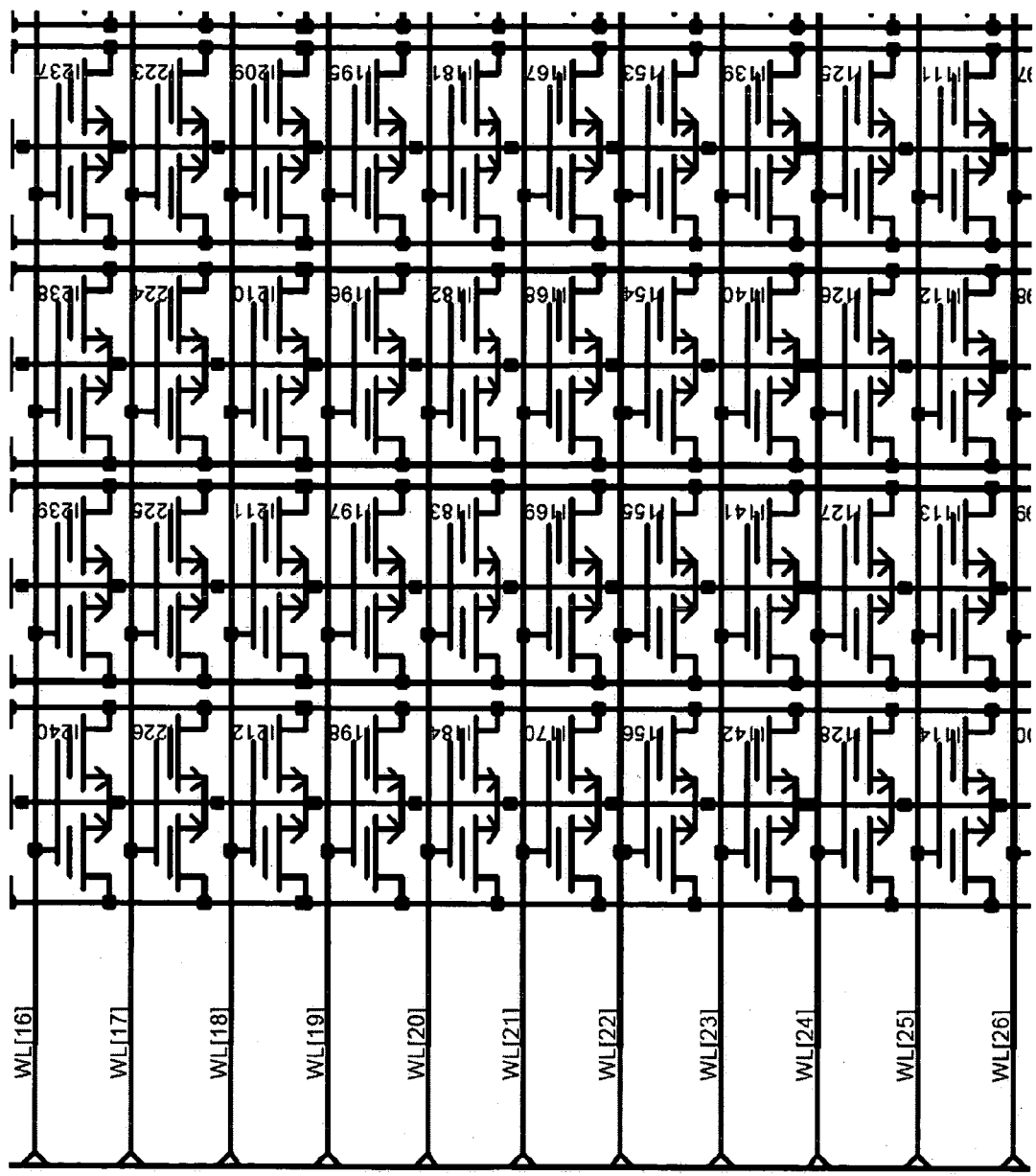
Figure 11:
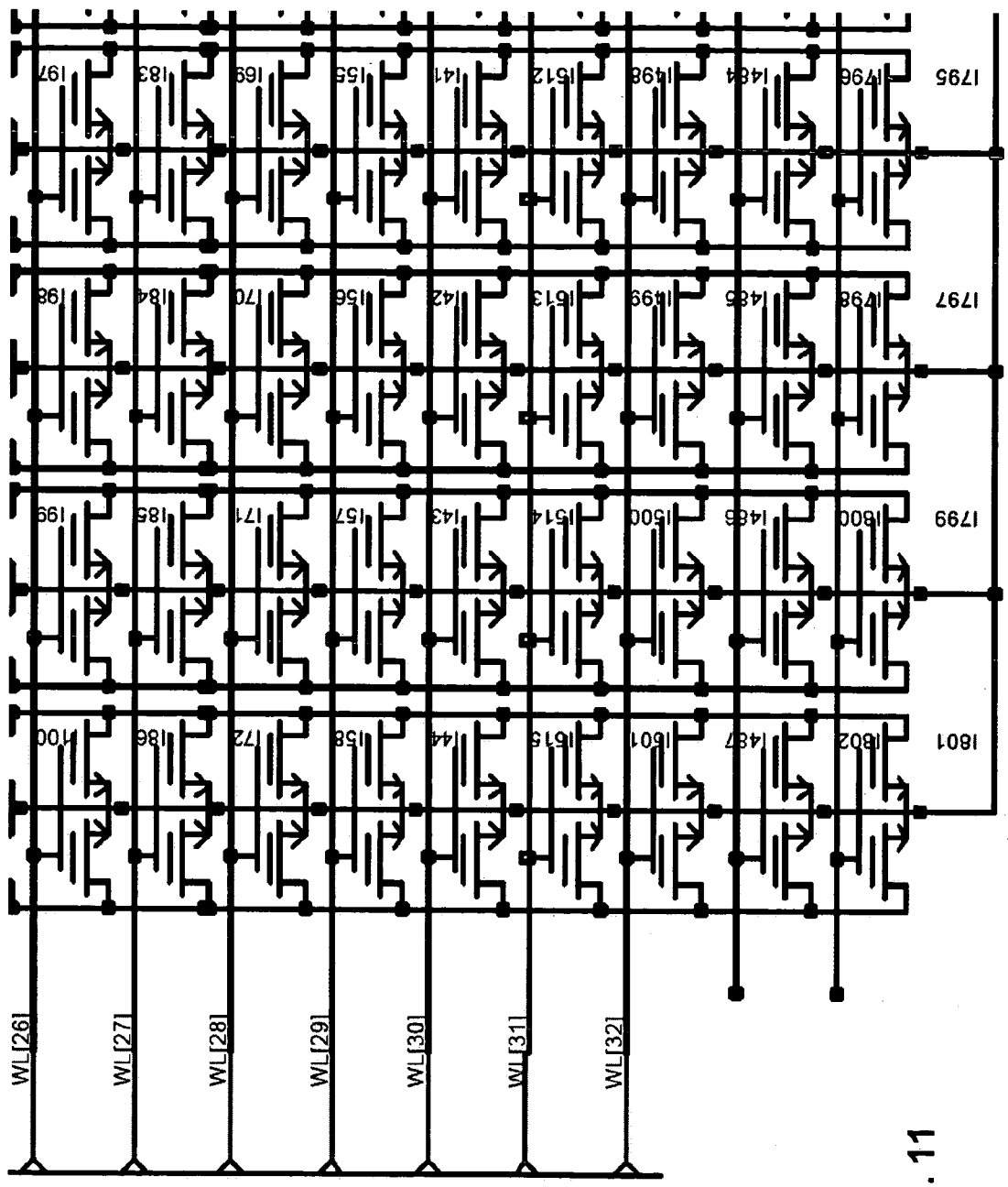
Figure 12:
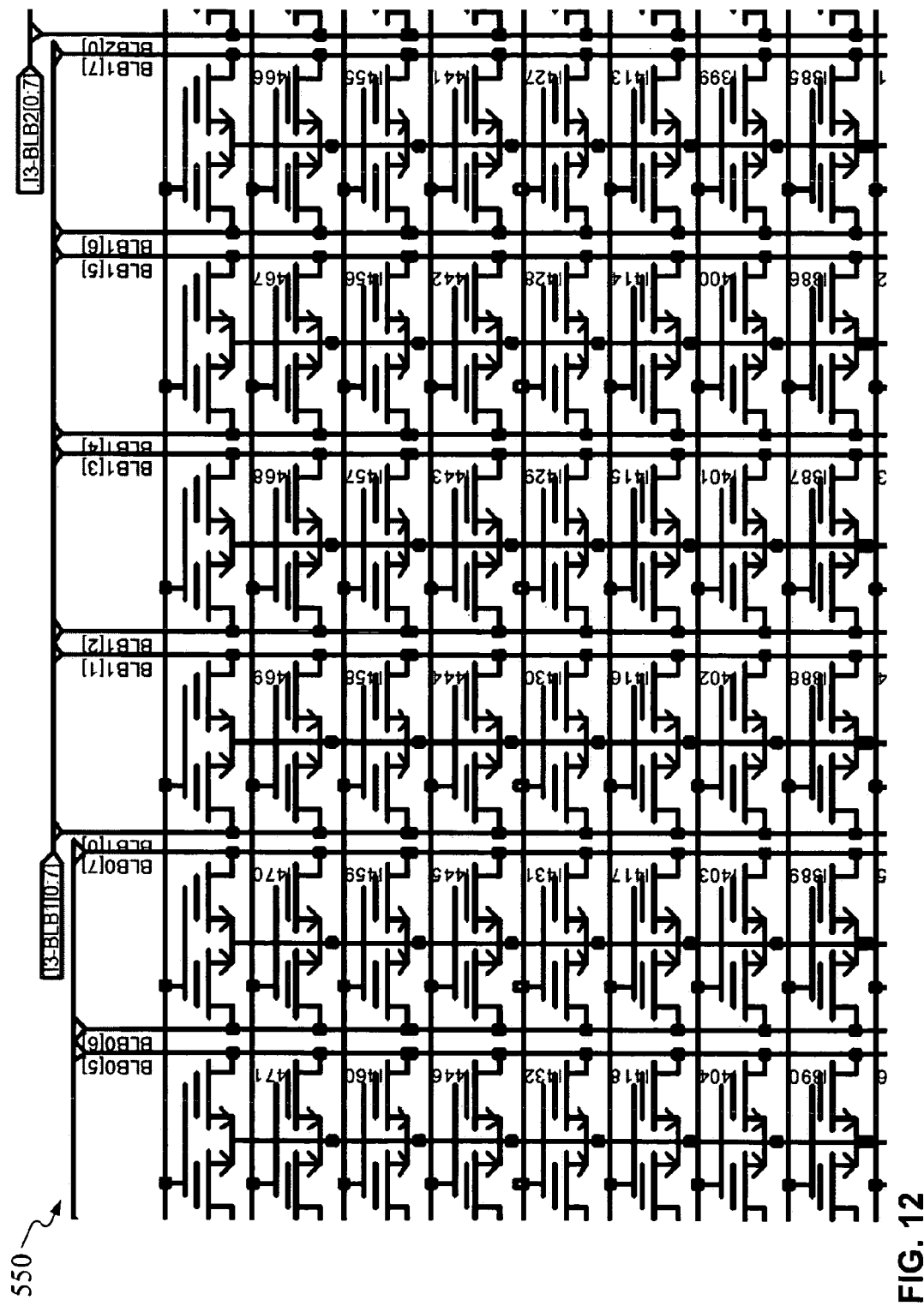
Figure 13:
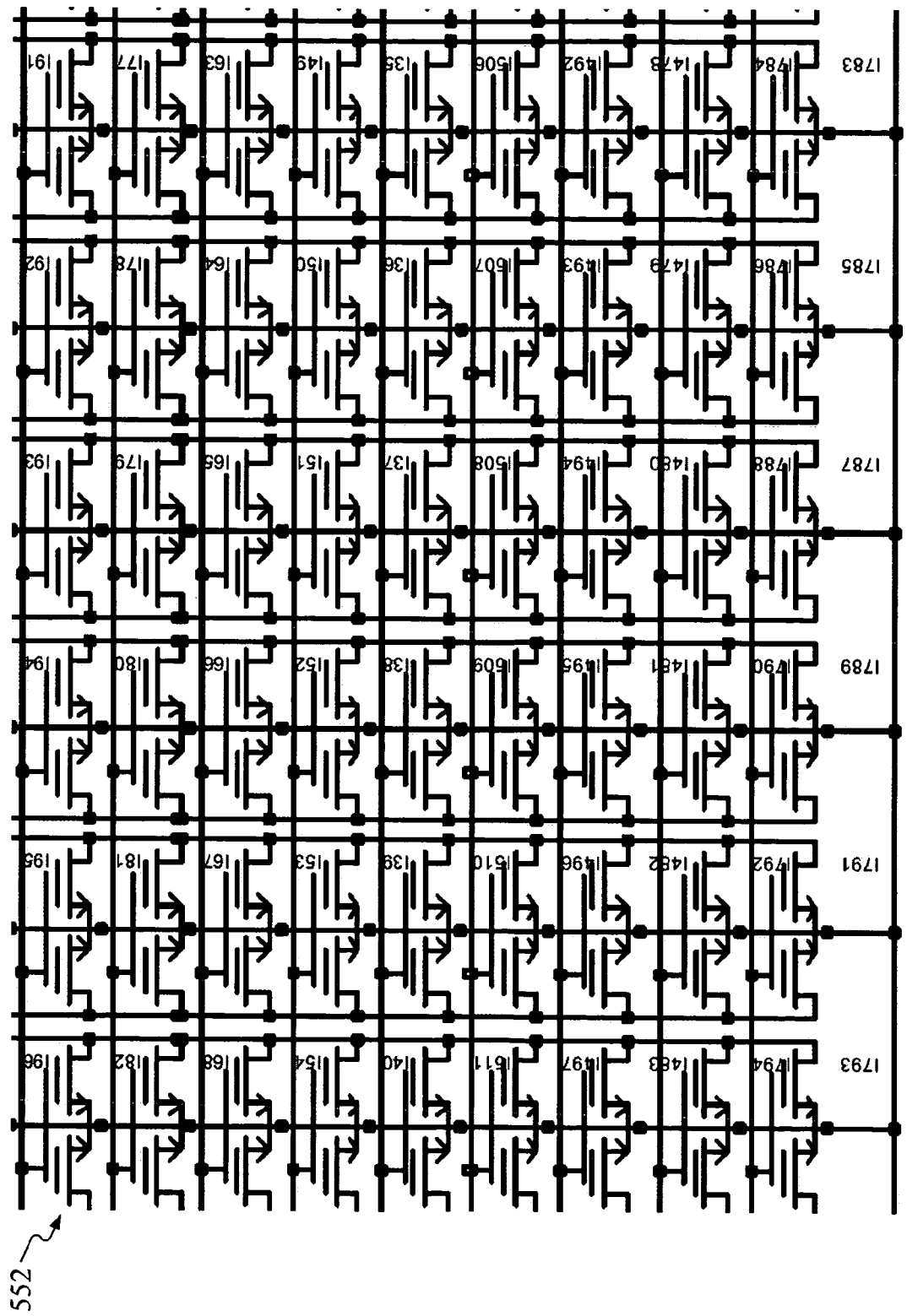
Figure 14:
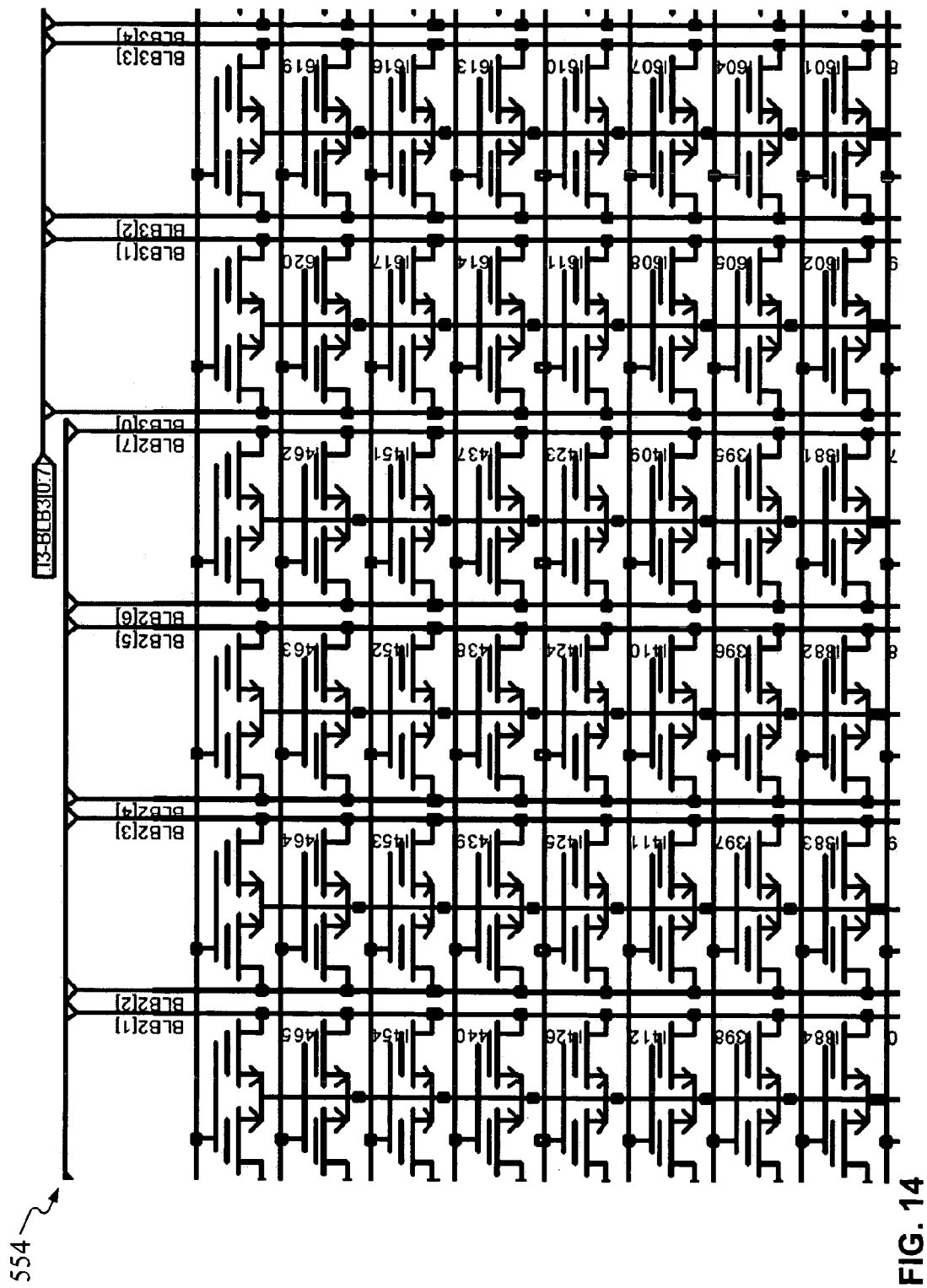
Figure 15:
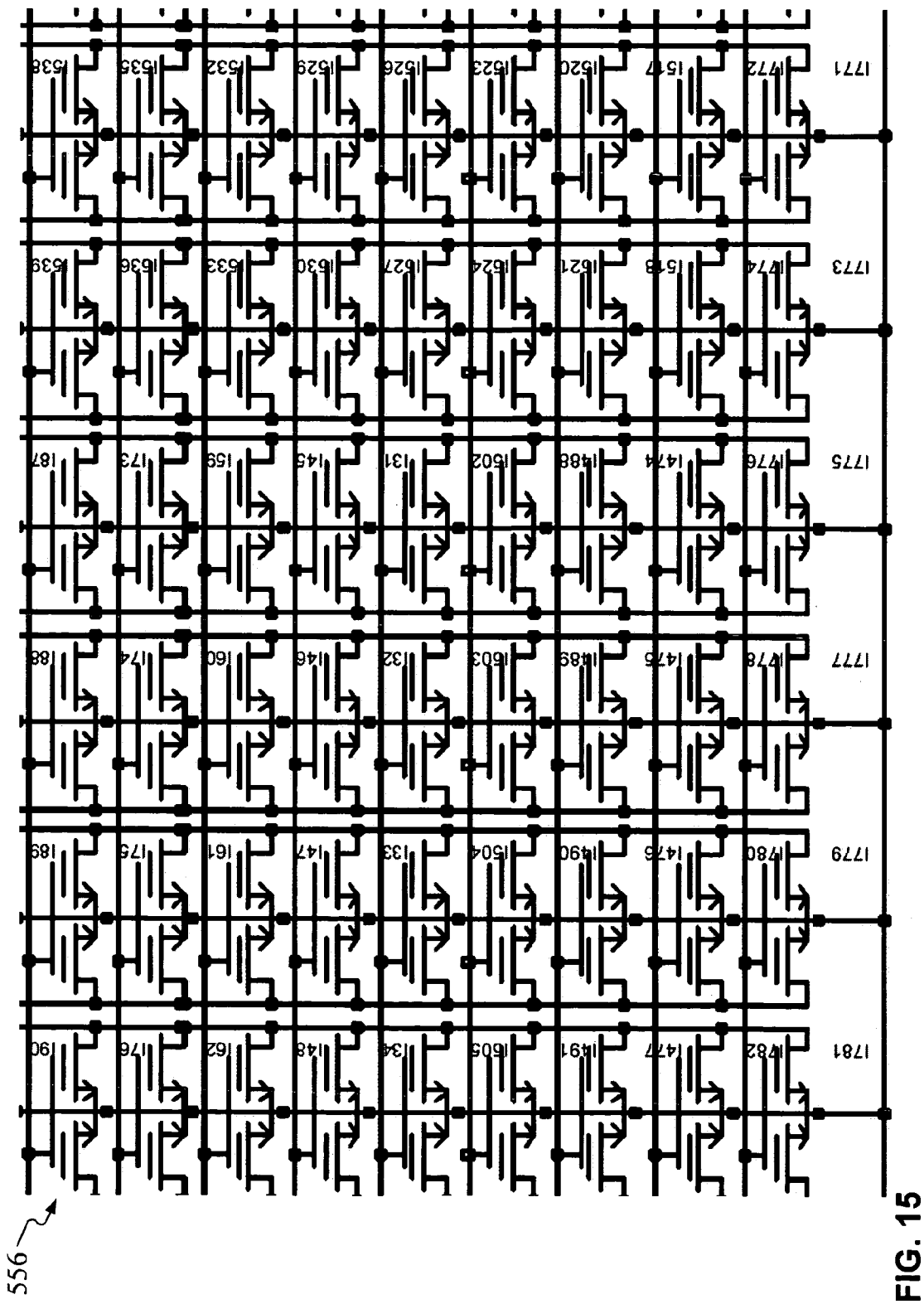
Figure 16:
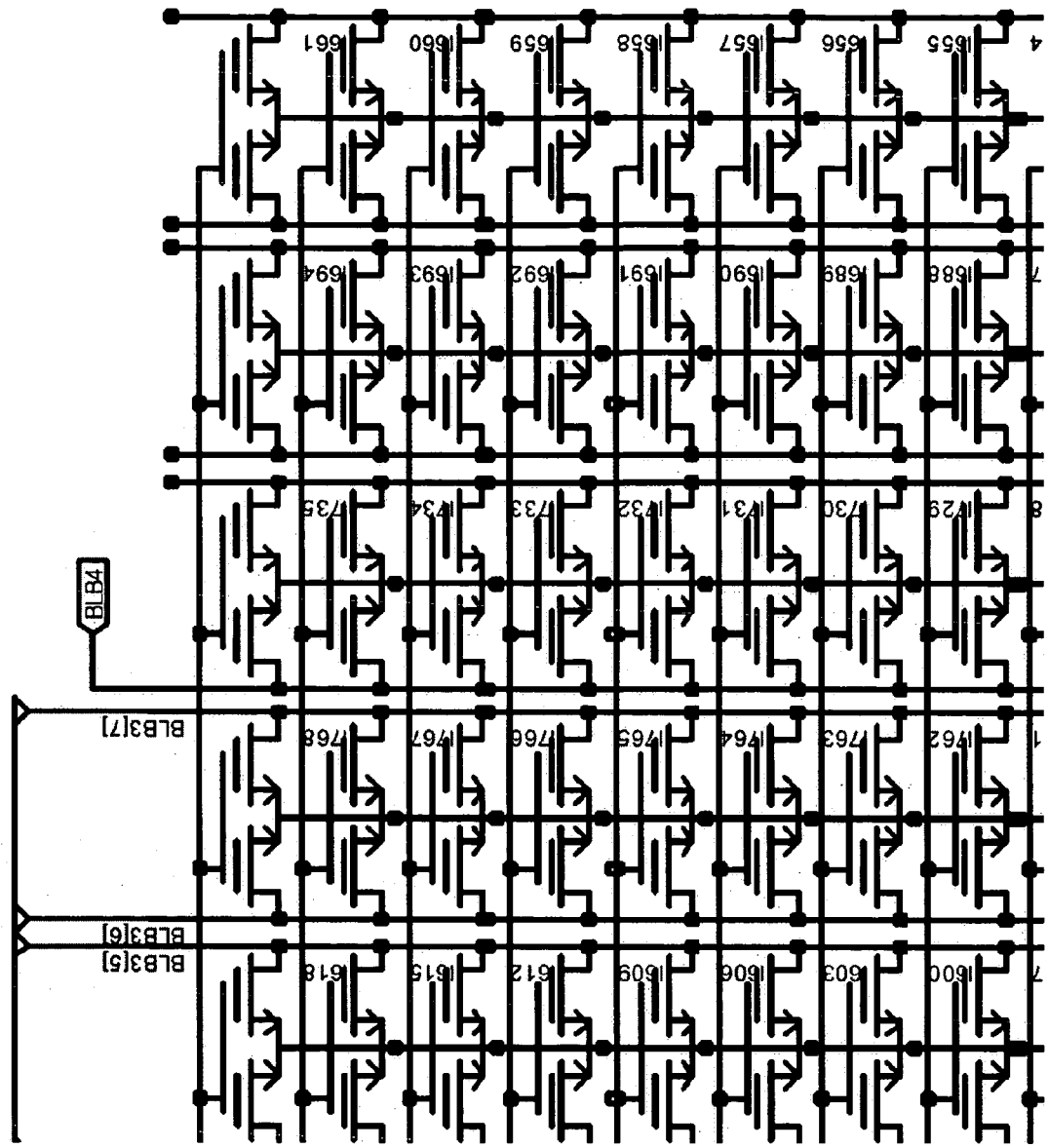
Figure 17:
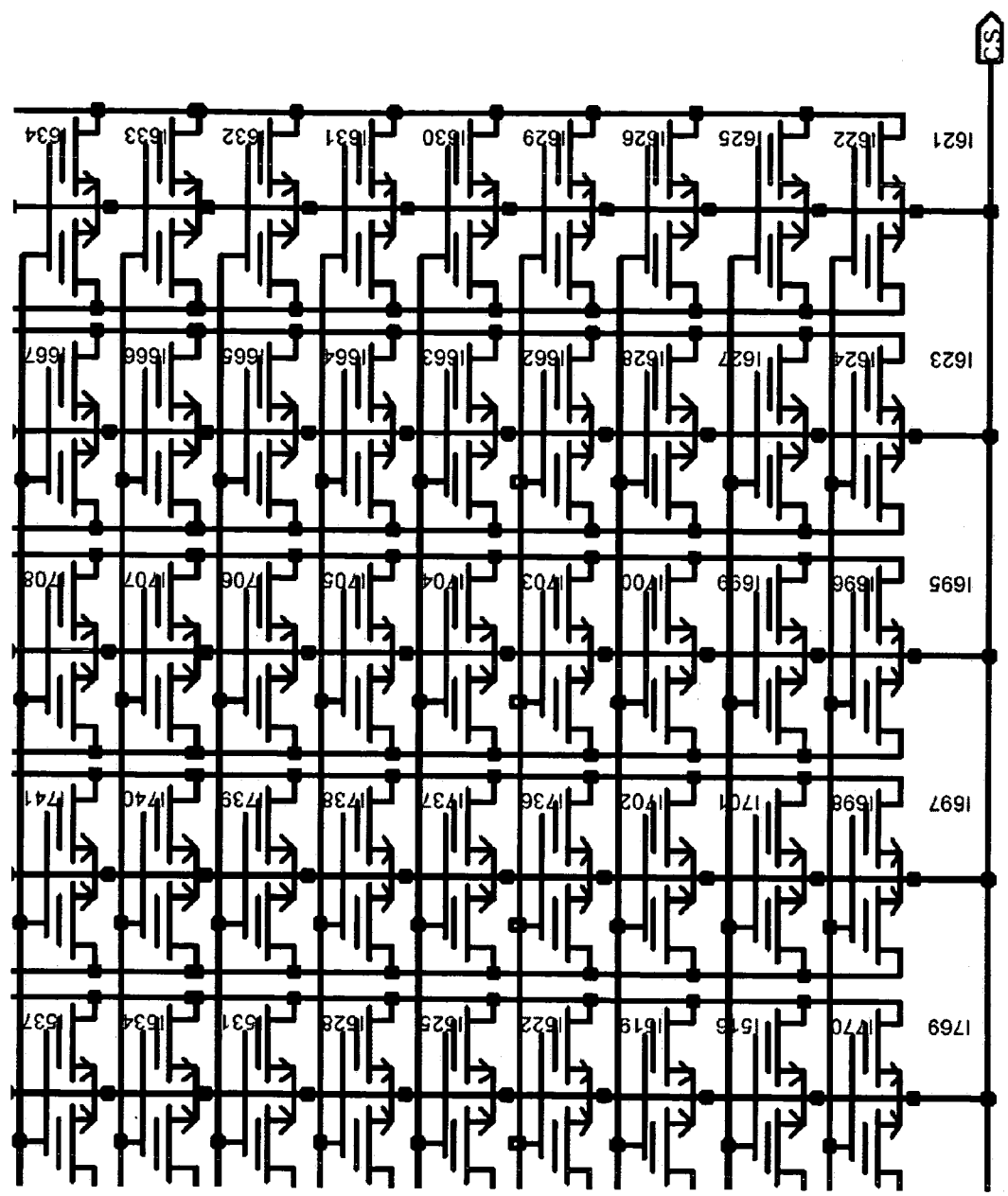
Figure 18:
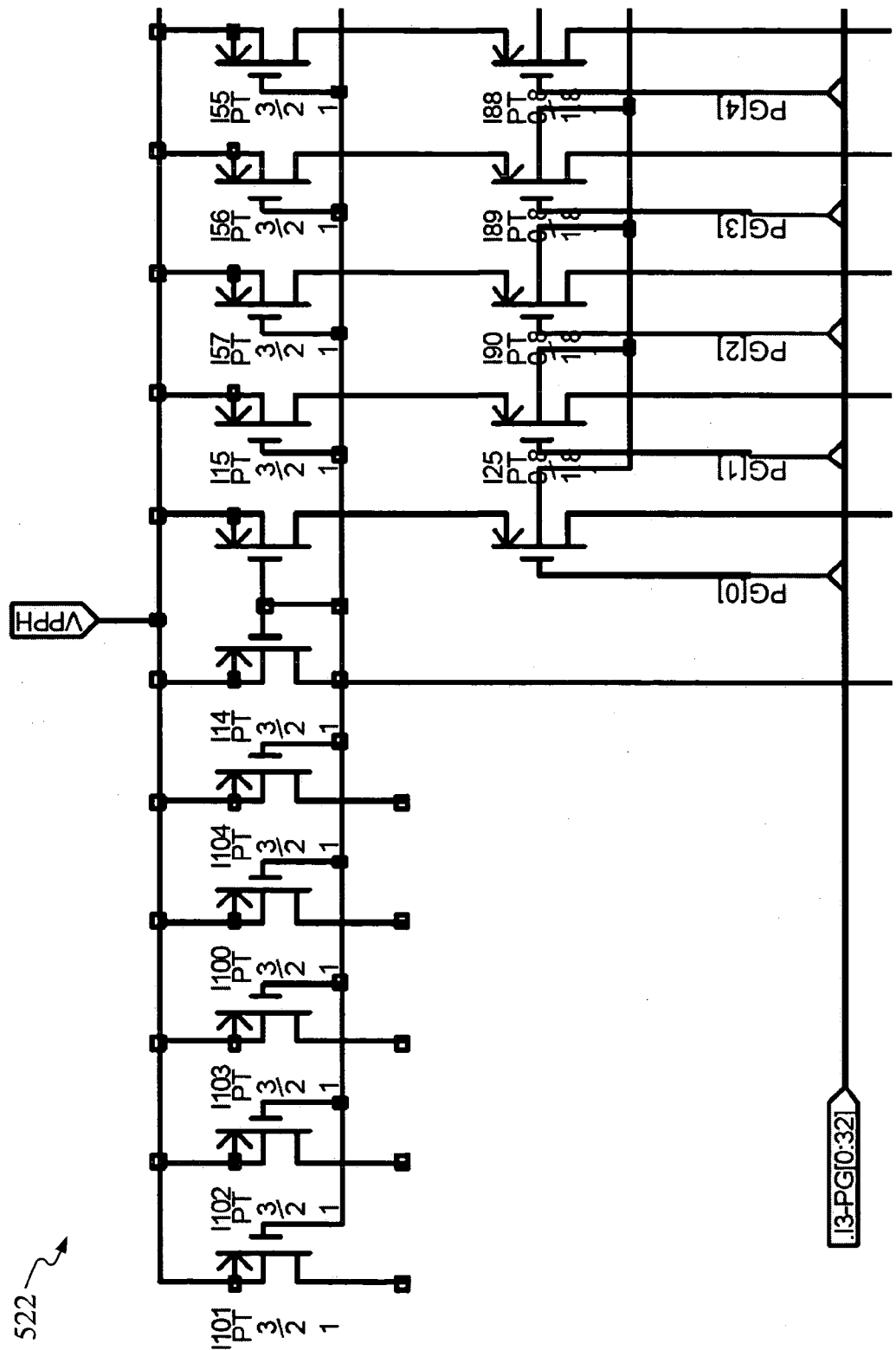
Figure 19:
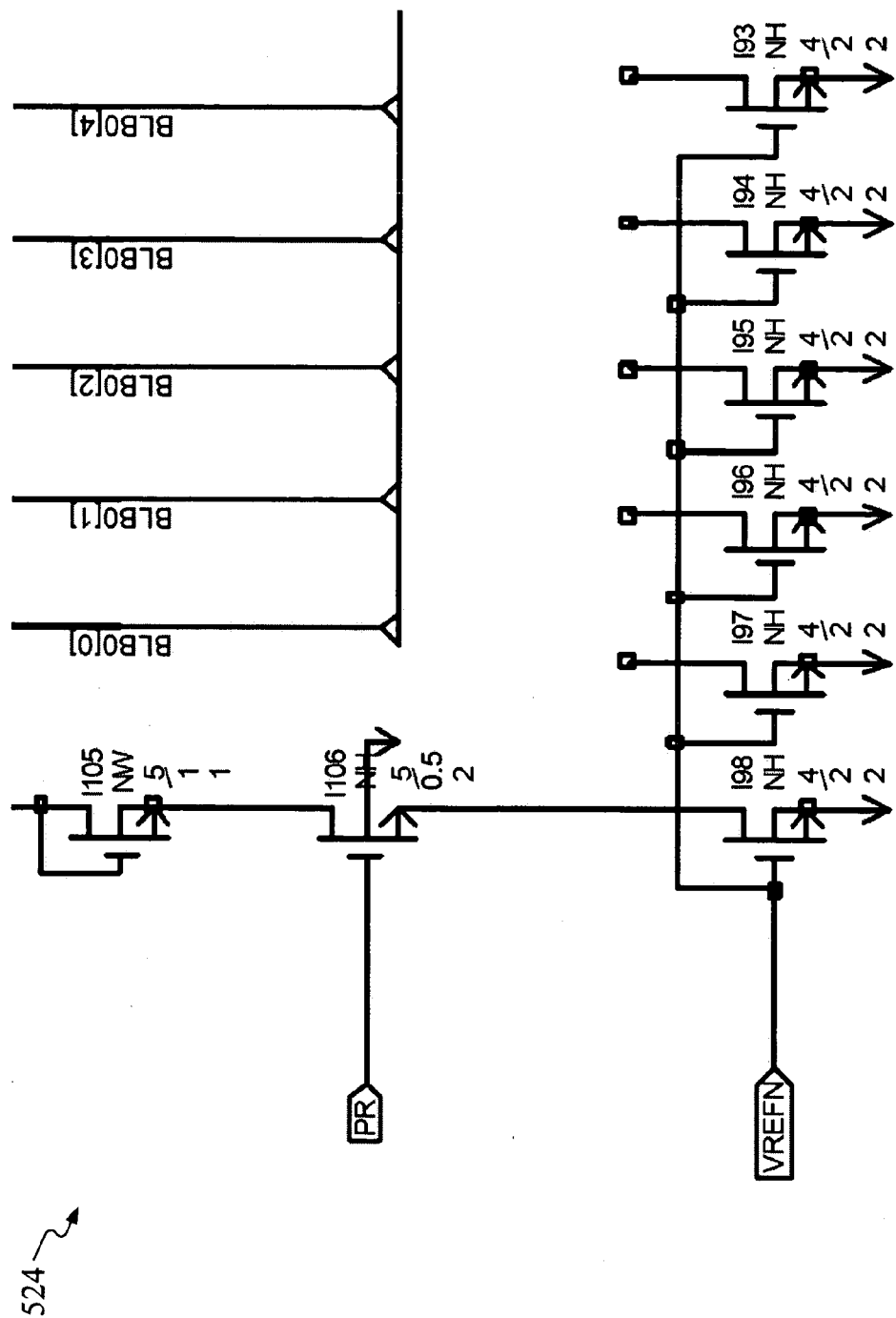
Figure 20:
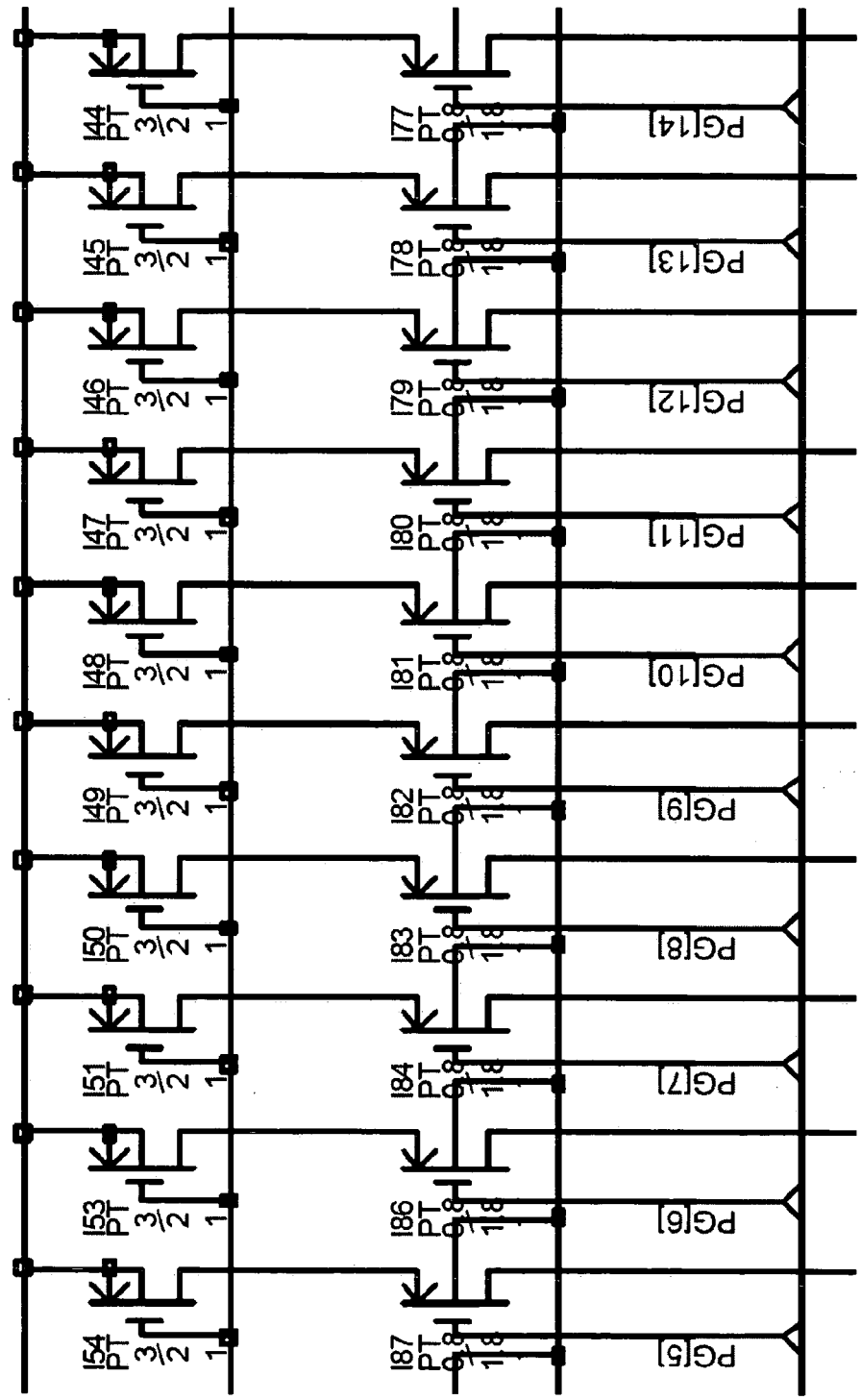
Figure 21:
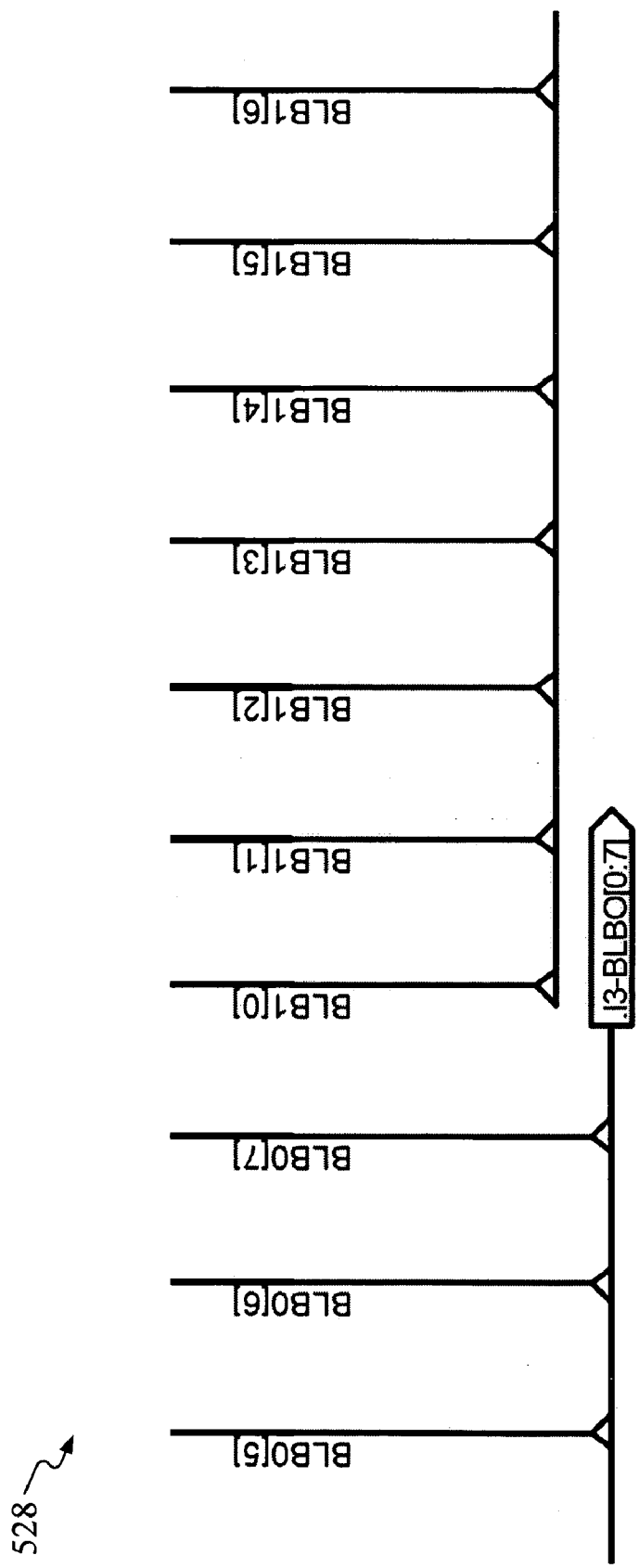
Figure 22:
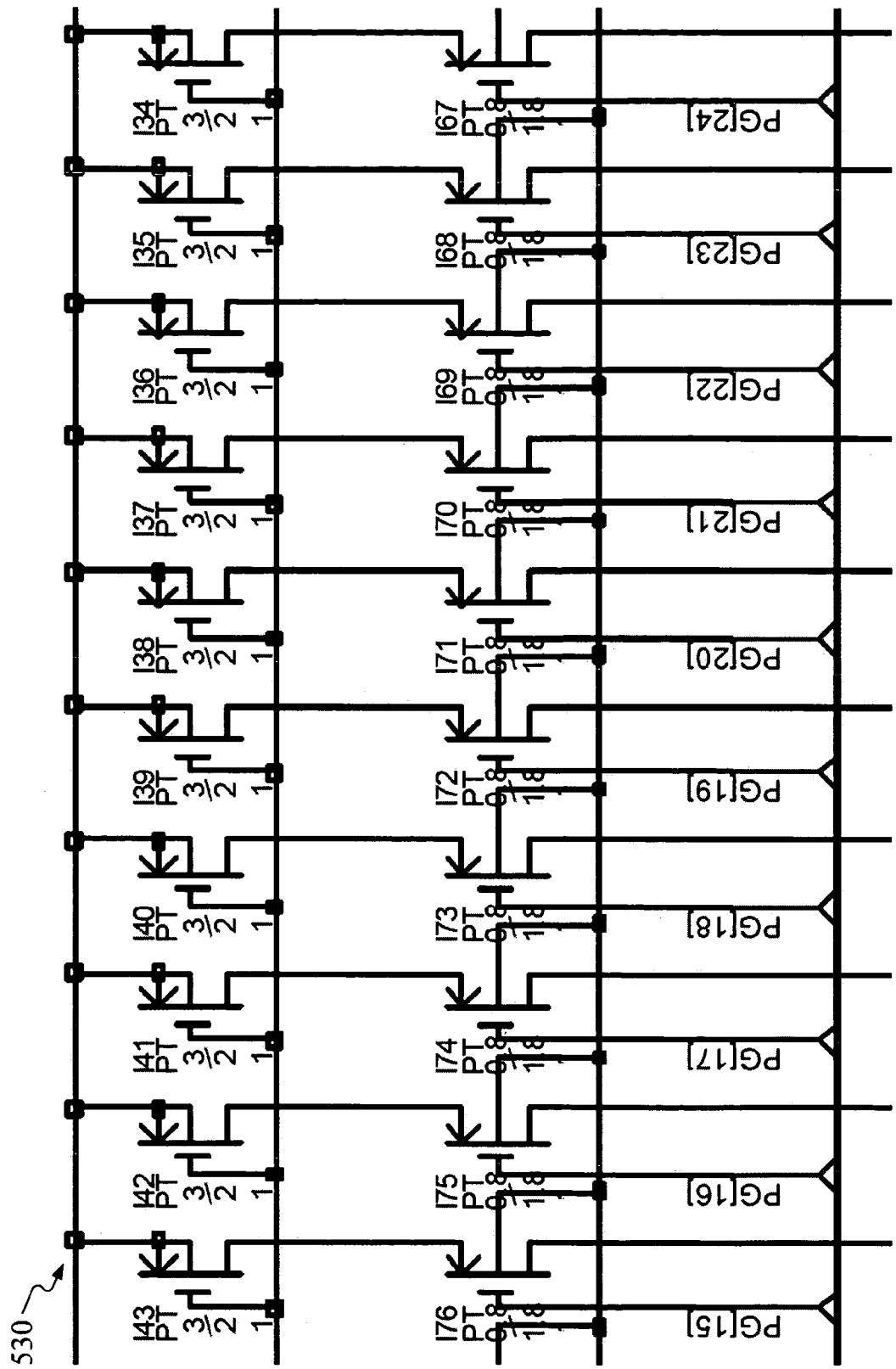
Figure 23:
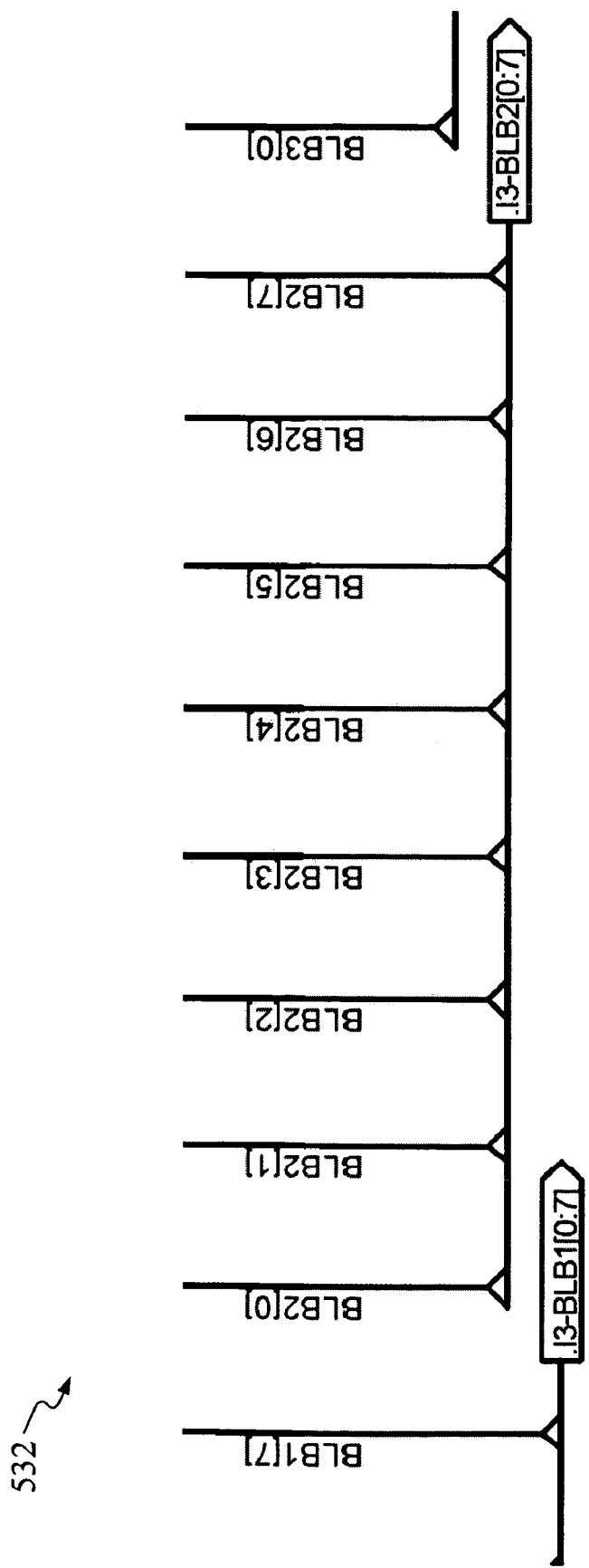
Figure 24:
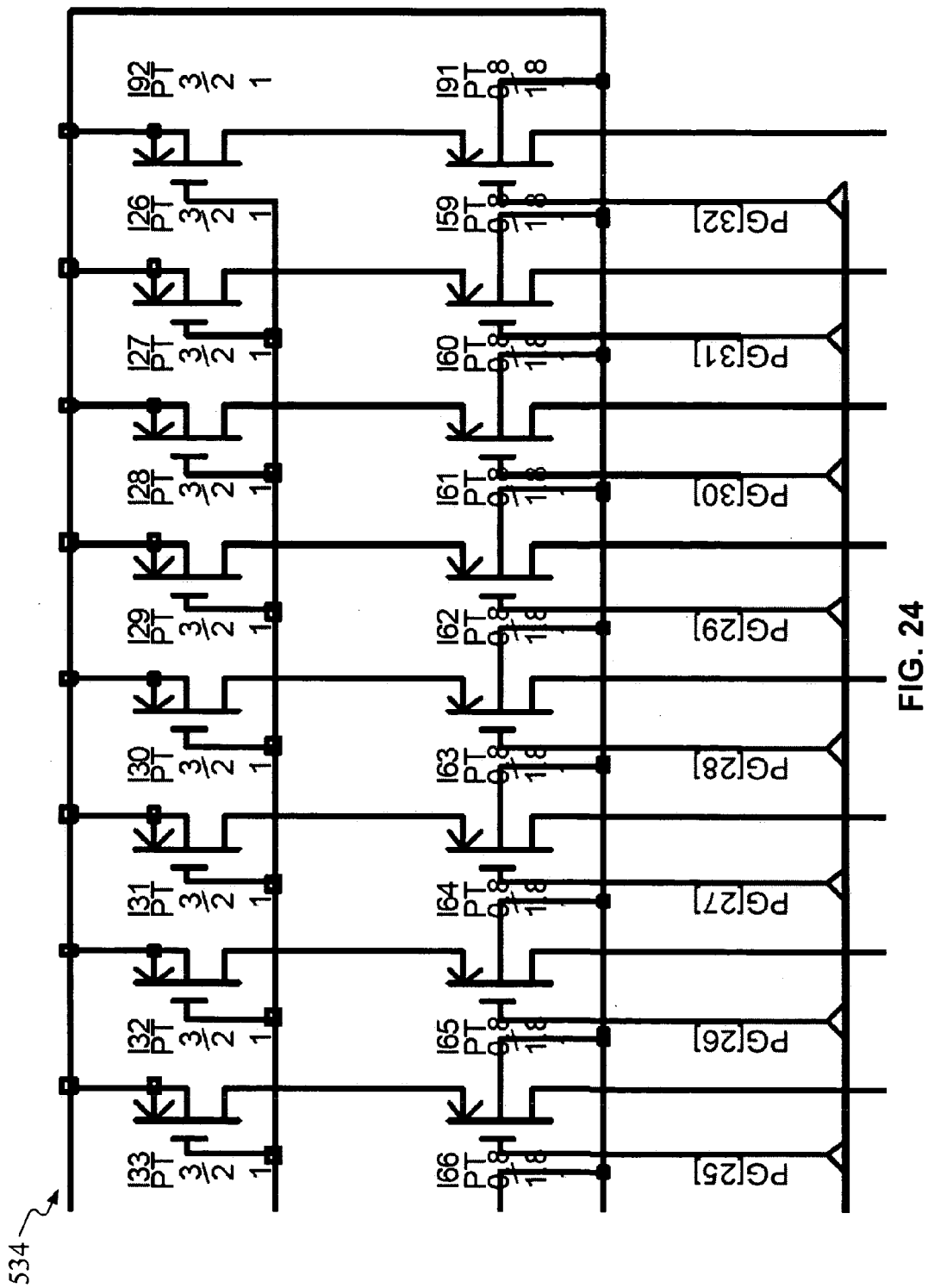
Figure 25:
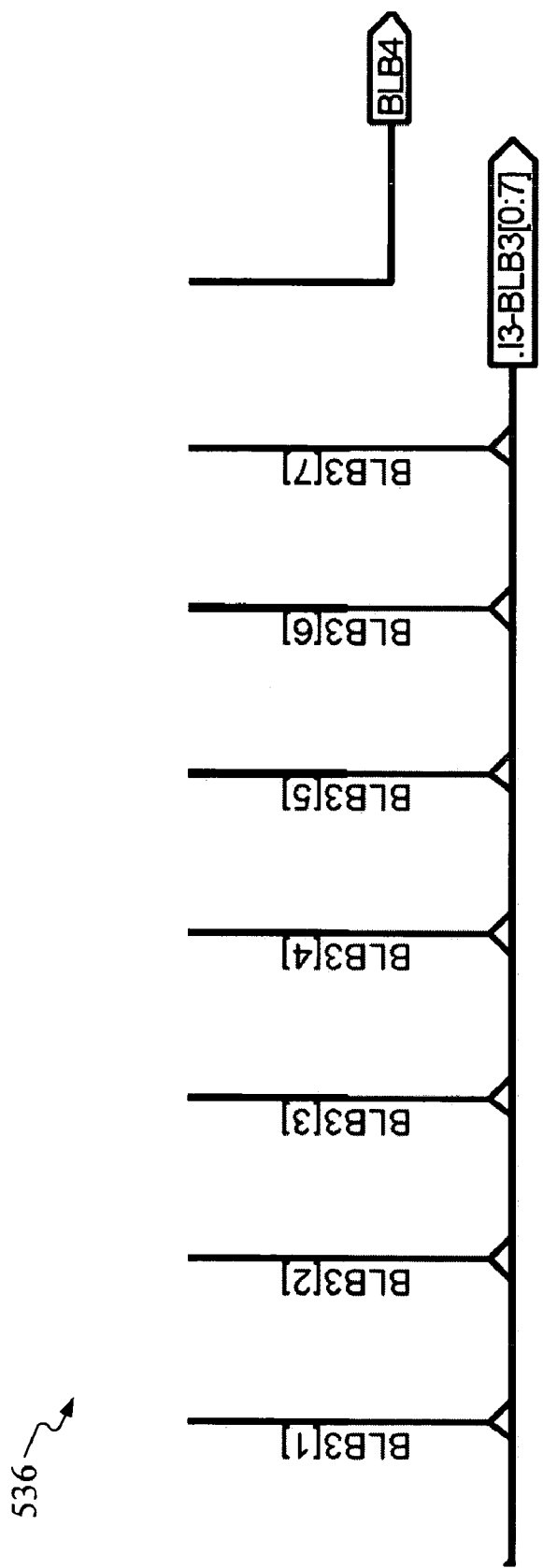

In addition, the RFID tags can be modular in nature, providing additional flexibility in the tag manufacturing process. FIG. 7 illustrates a reel-form substrate 700 that has modular RFID tags. A modular tag 710 includes an antenna 720 and a module 730, which includes a conductive pattern and a chip 740. For additional details regarding modular tag design and potential manufacturing processes, see the U.S. patent application entitled "ATTACHMENT OF RFID MODULES TO ANTENNAS", application Ser. No. 10/692,497, filed Oct. 24, 2003, and published Oct. 28, 2004 as U.S. Publication No. 2004-0215350, and also the U.S. Patent Application entitled, "CHIP ATTACHMENT IN AN RFID TAG", application Ser. No. 10/396,932, filed Mar. 25, 2003, and issued Jan. 3, 2006 as U.S. Pat. No. 6,982,190.

Other embodiments may be within the scope of the following claims.

What is claimed is:

1. A radio frequency identification tag comprising:
   an antenna;
   a radio frequency interface coupled with the antenna; and
   a non-volatile memory comprising multiple memory cells, at least one of the memory cells comprising a floating gate, a control gate, and a dielectric there between, and the non-volatile memory further comprising a controlled current source operable to modify the at least one memory cell;
   wherein the controlled current source comprises multiple transistors coupled with bit lines of the non-volatile memory, and an additional transistor configured to have a forced current and be in saturation, the additional transistor having a gate coupled with gates for the multiple transistors.

2. The radio frequency identification tag of claim 1, wherein the controlled current source comprises a current mirror that regulates currents in multiple bit lines of the non-volatile memory.

3. A radio frequency identification tag comprising:
   an antenna;
   a radio frequency interface coupled with the antenna; and
   a non-volatile memory comprising multiple memory cells, at least one of the memory cells comprising a floating gate, a control gate, and a dielectric there between, and the non-volatile memory further comprising a controlled current source operable to modify the at least one memory cell;
   wherein the non-volatile memory further comprises a voltage supply line regulator that limits voltage supply based on a sensed operational current that results from the controlled current source in the non-volatile memory.

4. The radio frequency identification tag of claim 3, wherein the voltage supply line regulator comprises a dummy cell, a transistor coupled with a voltage supply line of the non-volatile memory, and a current mirror coupled with the dummy cell through a second line, the transistor having a gate coupled with the second line.

5. The radio frequency identification tag of claim 4, wherein the second line comprises a bit line connecting multiple dummy cells, including said dummy cell, of the non-volatile memory.

6. The radio frequency identification tag of claim 5, wherein the non-volatile memory further comprises multiple transistors coupled with data bit lines of the non-volatile memory and with the current mirror.

7. The radio frequency identification tag of claim 5, wherein current through multiple bit lines of the non-volatile memory is controllable by a factor of 36.

8. The radio frequency identification tag of claim 3, wherein the controlled current source controls current through the at least one memory cell during programming of the at least one memory cell.

9. The radio frequency identification tag of claim 3, wherein the antenna comprises a near-field coupling element configured to operate in a high frequency band.

10. The radio frequency identification tag of claim 3, wherein the radio frequency interface comprises an analog portion of a complementary metal oxide semiconductor (CMOS) integrated circuit (IC), and the non-volatile memory comprises a digital portion of the CMOS IC.

11. The radio frequency identification tag of claim 3, wherein the dielectric comprises an oxide layer.

12. The radio frequency identification tag of claim 3, wherein the non-volatile memory comprises an electrically erasable programmable read-only memory.

13. A system comprising:
   a radio frequency identification (RFID) tag conveyor;
   a substrate having multiple RFID tags thereon, each RFID tag comprising a non-volatile memory including a controlled current source operable to modify memory cells in the non-volatile memory; and
   a programmer;
   wherein the non-volatile memory further comprises a voltage supply line regulator that limits voltage supply based on a sensed operational current that results from the controlled current source in the non-volatile memory when the programmer modifies values stored in the memory cells.

14. The system of claim 13, wherein the voltage supply line regulator comprises a dummy cell, a transistor coupled with a voltage supply line of the non-volatile memory, and a current mirror coupled with the dummy cell through a second line, the transistor having a gate coupled with the second line.

15. The system of claim 13, wherein the substrate comprises a reel-form substrate, and the RFID tag conveyor comprises at least two reels.

16. The system of claim 15, wherein the RFID tags comprise modular RFID tags.

17. The system of claim 13, wherein the programmer is configurable to read the RFID tags, erase the RFID tags and program the RFID tags.

18. A apparatus comprising:
an antenna;
a radio frequency interface coupled with the antenna; and
a non-volatile memory including means for forcing a current in a bit line of the non-volatile memory for a predetermined period of time to modify a memory cell in the non-volatile memory;
wherein the bit line comprises a dummy bit line, and the non-volatile memory further comprises means for sensing the current in the dummy bit line and limiting voltage being supplied to the memory cell based on the sensed current.

* * * * *